United States Patent [19]

Tsuji

[11] Patent Number: 5,454,901
[45] Date of Patent: Oct. 3, 1995

[54] PROCESS FOR TREATING SEMICONDUCTOR SUBSTRATES

[75] Inventor: Mikio Tsuji, Tokyo, Japan

[73] Assignee: NEC Corporation, Tokyo, Japan

[21] Appl. No.: 703,726

[22] Filed: May 21, 1991

[30] Foreign Application Priority Data

May 22, 1990 [JP] Japan ................................. 2-131809

[51] Int. Cl.⁶ ..................................................... H01L 21/00
[52] U.S. Cl. ............................. 156/643.1; 156/651.1; 156/662.1; 252/79.3; 134/1; 134/3
[58] Field of Search ................................. 156/662, 643, 156/668, 651; 252/79.3, 79.1; 134/1–3

[56] References Cited

U.S. PATENT DOCUMENTS

| | | | |
|---|---|---|---|
| 3,860,464 | 1/1975 | Erdman et al. | 252/79.3 X |
| 4,171,242 | 10/1979 | Liu | 252/79.3 X |
| 4,188,710 | 2/1980 | Davey et al. | 437/184 X |
| 4,264,374 | 4/1981 | Beyer et al. | 134/3 |
| 4,671,846 | 6/1987 | Shimbo et al. | 134/3 X |
| 4,885,047 | 12/1989 | Ury et al. | 156/643 X |
| 4,962,065 | 10/1990 | Brown et al. | 437/242 |
| 5,051,134 | 9/1991 | Schnegg et al. | 156/662 X |
| 5,078,832 | 1/1992 | Tanaka | 156/639 |

FOREIGN PATENT DOCUMENTS 240792  7/1971  U.S.S.R. .

OTHER PUBLICATIONS

Kern et al., "Cleaning Solutions Based on Hydrogen Peroxide for use in Silicon Semiconductor Technology", RCA Review, Jun. 1970, pp. 187–207.

*Primary Examiner*—Thi Dang
*Attorney, Agent, or Firm*—Burns, Doane, Swecker & Mathis

[57] ABSTRACT

Semiconductor substrates are treated in a treating solution consisting of hydrofluoric acid, hydrogen peroxide and a purified water or in a treating solution consisting of hydrofluoric acid, ammonium fluoride, hydrogen peroxide and a purified water, wherein the treating solution preferably has a hydrofluoric acid concentration of 0.1 to 10 wt % and a hydrogen peroxide concentration of 0.1 to 15 wt %. A process for treating semiconductor substrates is provided according to this invention, which allows less inclusion of metallic impurities from the treating solution and has excellent ability of removing metallic impurities with a very small amount of microparticles deposited on the substrate. The number of microparticles deposited on the semiconductor substrates can be reduced to about $1/10$ the level in the conventional process.

6 Claims, 6 Drawing Sheets

PROCESS FOR TREATING SEMICONDUCTOR SUBSTRATES

BACKGROUND OF THE INVENTION

1. Field of the Invention

This invention relates to a process for treating a semiconductor substrate, particularly to a process which can show an excellent effect of removing metallic impurities and reduce deposit of microparticles.

2. Description of the Prior Art

Such processes for treating semiconductor substrates conventionally used include $H_2SO_4/H_2O_2$ (hereinafter referred to as SPM) or $NH_4OH/H_2O_2/H_2O$ (hereinafter referred to as APM) treatment for removing organic matters; SPM or $HCl/H_2O_2/H_2O$ (hereinafter referred to as HPM) treatment for removing metallic impurities; and a buffered hydrofluoric acid (hereinafter referred to as BHF) or dilute hydrofluoric acid ($HF/H_2O$ hereinafter referred to as DHF) treatment for removing oxide films. These processes all predominantly employ a so-called dipping treatment where semiconductor substrates are treated by dipping them in a treating solution. In addition to the above processes, a dry method utilizing ozone for removing organic matters or utilizing hydrofluoric acid vapor for removing oxide films are gradually put into practical uses.

The dip treatment in these conventional processes for treating semiconductor substrates employs one or more treatments using treating solutions selected from APM, SPM, HPM, DHF and BHF. However, APM shows relatively great effect of removing metals which are liable to form complexes with ammonia such as Cu but generally has poor ability of removing single metals compared with the treating solutions based on acids such as SPM and HPM. Further, while hydrogen peroxide is added as an oxidizing agent to APM so as to prevent overetching of semiconductor substrates, any metallic impurities very susceptible to oxidation such as Al and Fe contained in the treating solution will be taken or included into the natural oxide film to be formed during the treatment due to the high oxidation property of hydrogen peroxide. The metal impurities thus taken into the oxide film diffuse throughout the semiconductor substrate during the subsequent heat treatment to cause increase in the junction leakage, reduction of carrier lifetime and deterioration of the property of holding DRAM. Moreover, when gates are formed, such metal impurities diffused cause reduction in the withstand voltage of the gate oxide film or Vt fluctuation. Accordingly, APM is scarcely used singly in a washing process for removing such metal impurities, and an additional acid treatment such as with SPM or HPM, or a DHF or BHF treatment for removing the natural oxide film to be formed during the APM treatment is carried out.

SPM and HPM have a considerably great effect of removing metallic impurities since they can remove such impurities by dissolving them therein with the aid of the acid components. However, even SPM or HPM causes a natural oxide film to be formed on the substrate surface by the act of the hydrogen peroxide contained in the treating solution, and when the concentration of the metallic impurities in the treating solution is high, these impurities are taken into the natural oxide film.

As more and more integration proceeds in devices, recently the gate oxide film and the capacitative insulating film are made thinner and thinner. Treatment with APM, SPM or HPM inevitably forms a natural oxide film having a thickness of 10 to 20 Å. When a thin oxide film with a thickness of about 100 Å is to be formed, the natural oxide film causes deterioration of the oxide film or nonuniform film thickness. Accordingly, higher importance is put on the prevention of such natural oxide film formation.

On the other hand, inclusion of metallic impurities such as Al and Fe hardly occurs by the treatment with DHF or BHF since DHF and BHF can remove the natural oxide film. The DHP or BHF treatment, however, suffers a problem that any metal particles having less ionization tendency (e.g. Cu and Au) than in silicon present in the treating solution cause to expose the silicon crystal surface, so that the metal particles precipitate on the substrate surface.

The treatment with DHF or BHF further suffers a problem that microparticles deposit on the semiconductor substrate. It is said that the size of the microparticles which affect the characteristics of devices is about $1/10$ of the size of the design rule. For example, in a 4M DRAM, microparticles with a particle size of 0.1 μm or less affect the device characteristics. The microparticles deposited on the semiconductor substrate cause, for example, pattern defects in lithography or abnormal thickness of the oxide film in an oxidation.diffusion process, leading to deterioration in the withstand voltage of the gate oxide film or abnormal diffusion.

On the other hand, dry washing typified by UV-ozone washing and hydrofluoric acid vapor washing scarcely causes in principle deposition of microparticles or contamination with metallic impurities, but the metallic impurities originally deposited on the semiconductor substrate can hardly be removed therewith.

As described above, none of the conventional treating process can show excellent effect of removing any metals with reduced number of deposited microparticles.

SUMMARY OF THE INVENTION

It is an object of this invention to provide a process for treating a semiconductor substrate which can remove any kind of metal with reduced number of deposited microparticles.

The present inventor made intensive studies with a view to providing a process for treating a semiconductor substrate to find that the intended object can be achieved by treating a semiconductor substrate in a treating solution consisting of hydrofluoric acid, hydrogen peroxide and a purified water or in a treating solution consisting of hydrofluoric acid, ammonium fluoride, hydrogen peroxide and a purified water. The above treating solution preferably has a hydrofluoric acid concentration of 0.1 to 10 and a purified water. The above treating solution preferably has a hydrofluoric acid concentration of 0.1 to 10 wt % and a hydrogen peroxide concentration of 0.1 to 15 wt %.

DESCRIPTION OF THE PREFERRED EMBODIMENTS

This invention will be described below by way of preferred embodiments referring to the attached drawings.

Figure 1:
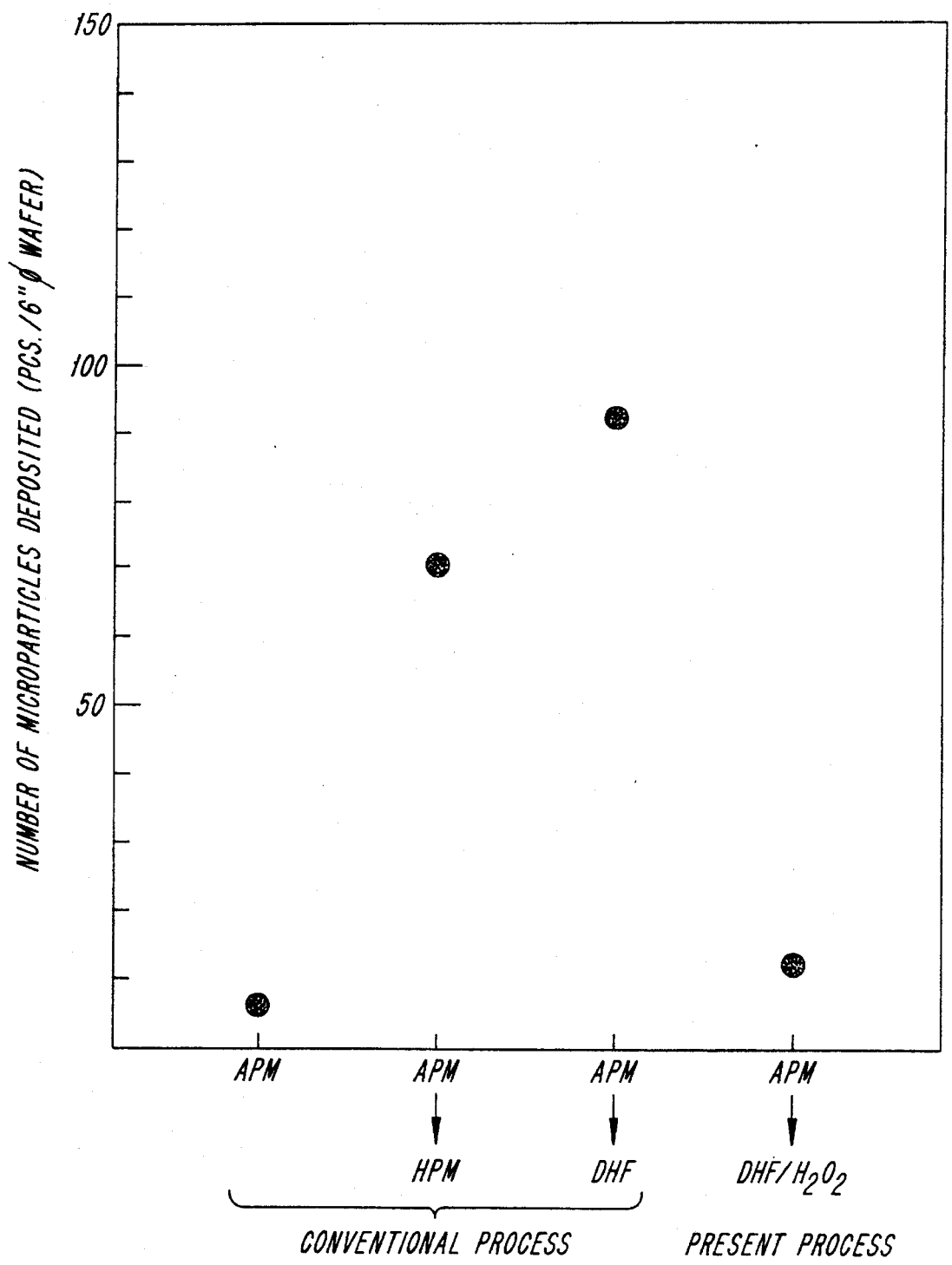
FIG. 1 is a plot comparing the number of microparticles deposited on the semiconductor substrate treated according to this invention with those according to the conventional methods.

FIG. 1 shows the numbers of microparticles deposited on the semiconductor substrate treated according to this invention and those according to the conventional methods; wherein the conventional processes employ APM, APM→HPM and APM→DHF treatments, while the present process employs APM→$DHF/H_2O_2$ treatment. Semiconductor substrates were immersed in the treating solutions, respectively, for 10 minutes, and then rinsed in a purified water for 10 minutes, followed by centrifugal drying.

In the conventional processes, the number of microparticles deposited was the smallest in the APM treatment, several tens of partices in the APM→HPM treatment and about 100 particles in the APM→DHF treatment; whereas the number of microparticles deposited was extremely reduced to the APM→$DHF/H_2O_2$ treatment according this invention and comparable to that in the conventional APM treatment. Thus, the present process can notably reduce the number of microparticles to be deposited on the semiconductor substrate over the conventional DHF treatment. While DHF treatment is used in combination with APM treatment in this embodiment, APM originally has an excellent effect of removing microparticles and this combination can exhibit excellent effect of removing the microparticles transferred from the previous step.

Figure 2:
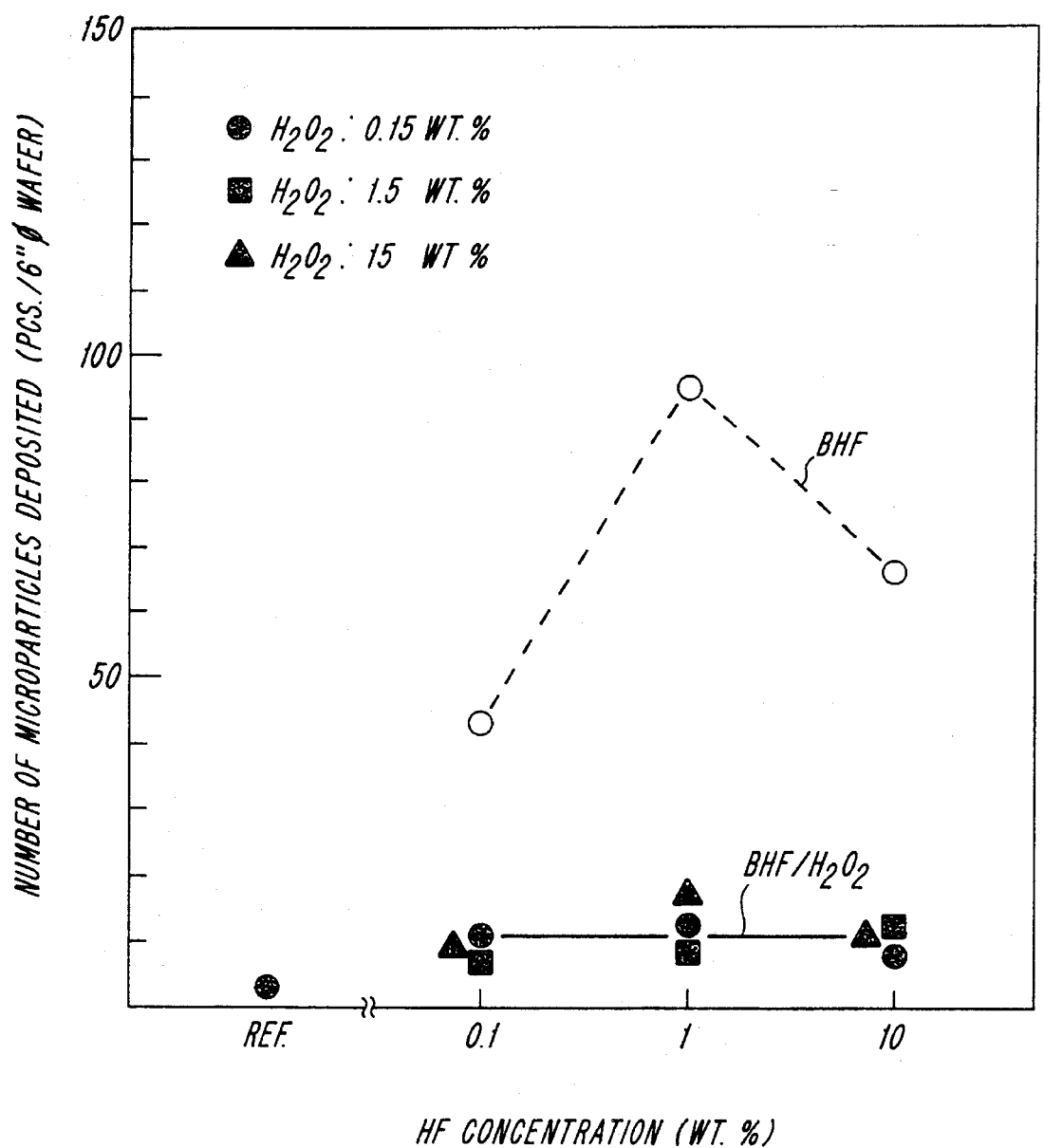
FIG. 2 is a plot showing the relationship between the number of microparticles deposited in the $BHF/H_2O_2$ treatment according to this invention and the HF and $H_2O_2$ concentrations in the treating solution.
Figure 3A:
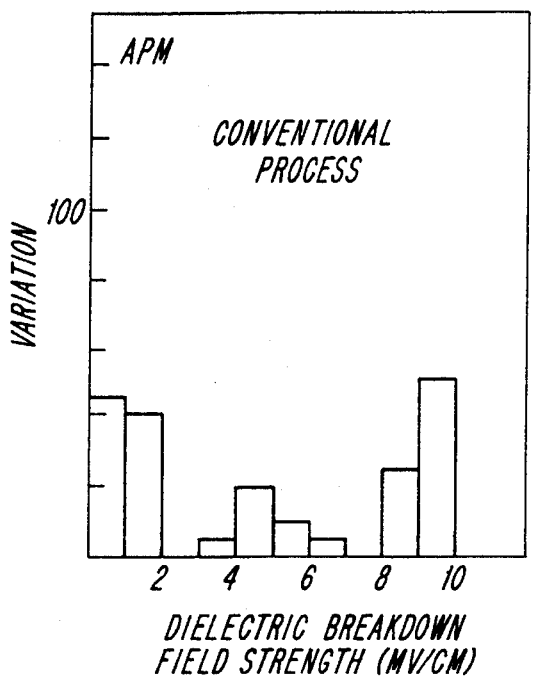
FIG. 3 are graphs showing distributions of dielectric breakdown field strength of the gate oxide films when the present process and the conventional process are applied to MOS capacitors, respectively.
Figure 3B:
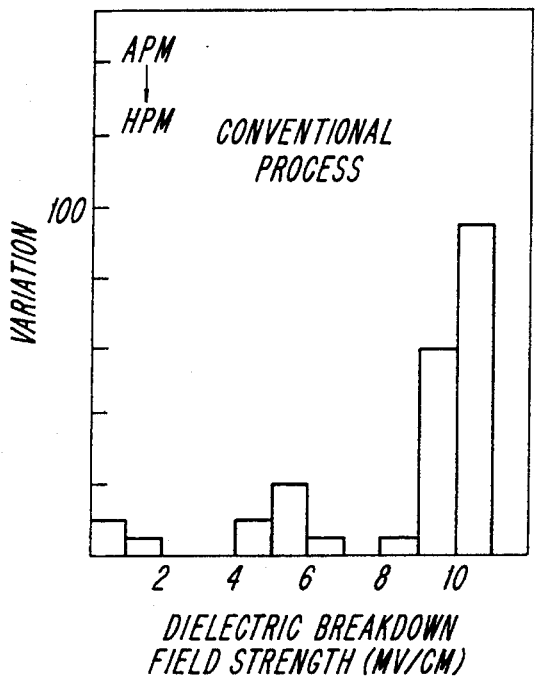
Figure 3C:
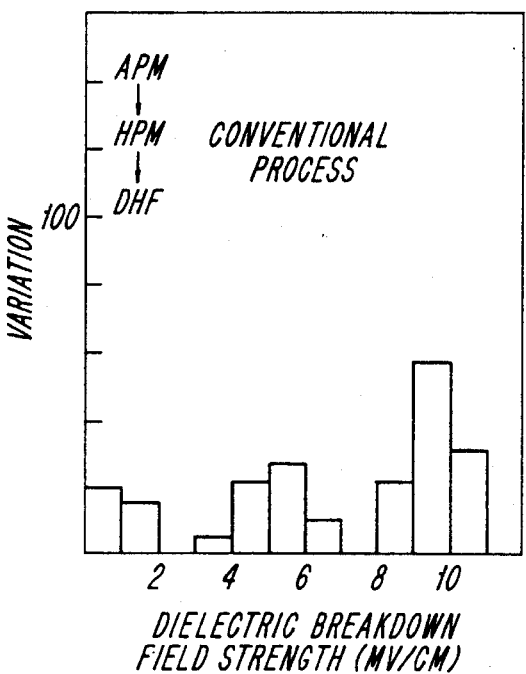
Figure 3D:
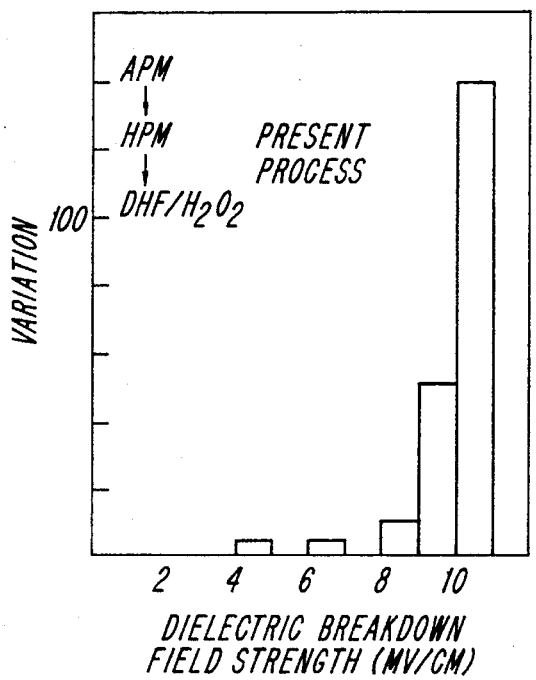

The effect of reducing microparticles to be deposited can likewise be achieved in the $BHF/H_2O_2$ treatment. FIG. 2 shows the relationship between the number off microparticles deposited on the semiconductor substrate in the $BHF/H_2O_2$ treatment according to this invention and the HF and $H_2O_2$ concentrations in the treating solution; wherein data of single BHF treatment is shown as the conventional process. Semiconductor substrates were treated in the treating solutions, respectively, for 10 minutes and then rinsed in a purified water for 10 minutes. A blank substrate rinsed only with a purified water was used as a reference.

In the conventional BHF treatment, about 100 pieces of microparticles deposited on each substrate, and the number of microparticles varied over a wide range. On the contrary, the number of microparticles deposited was extremely reduced in the present $BHF/H_2O_2$ treatment, which is comparable to that of the reference. Even when the $BHF/H_2O_2$ ratio was varied, no significant variation in the number of microparticles occurred. Thus, the present $BHF/H_2O_2$ treatment allows less deposition of microparticles having been suffered in etching of oxide films using BHF.

FIG. 3 shows distribution of dielectric breakdown field strength of gate oxide films when the present process and the conventional process are applied to MOS capacitors; wherein the conventional processes employ APM, APM→HPM and APM→HPM→DHF treatments; whereas the present process employs APM→HPM→$DHF/H_2O_2$ treatment.

In the conventional processes, initial failure, so-called A mode failure frequently occurs by the single APM treatment, and besides B mode failure such as a field strength of less than 8 MV/cm and very few samples showed a field strength of 8 MV or higher, so-called intrinsic withstand voltage; whereas the APM→HPM or APM→HPM→DFH treatment suffers a considerable number of B mode failure, although A mode failure was greatly reduced. On the contrary, in the semiconductor substrates subjected to APM →HPM→$DHF/H_2O_2$ treatment according to this invention, no A mode failure was observed and substantially all of the samples retained a field strength of 9 MV/cm or higher.

If microparticles deposit on the surface of a semiconductor substrate during the formation of gate oxide film, pin holes are liable to be formed in the resulting film. If the substrate surface is contaminated with impurities such as heavy metals, the film properties of the oxide film itself will be deteriorated or the oxide film comes to have nonuniform thickness due to the accelerated or retarded oxidation caused by the impurities. Such pin hole formation, deterioration of oxide film properties or nonuniform film thickness of the oxide film causes drop in the withstand voltage. Accordingly, the treating process according to this invention suffers least contamination with microparticles or metallic impurities over the conventional processes.

Incidentally, while treatments are carried out in the sequence of APM→HPM→$DHF/H_2O_2$ in this embodiment, a comparable effect was yielded when HPM was replaced by SPM. Further, it is of course possible to change this sequence depending on the previous step, subsequent step and the state of the surface of semiconductor substrate.

Figure 4:
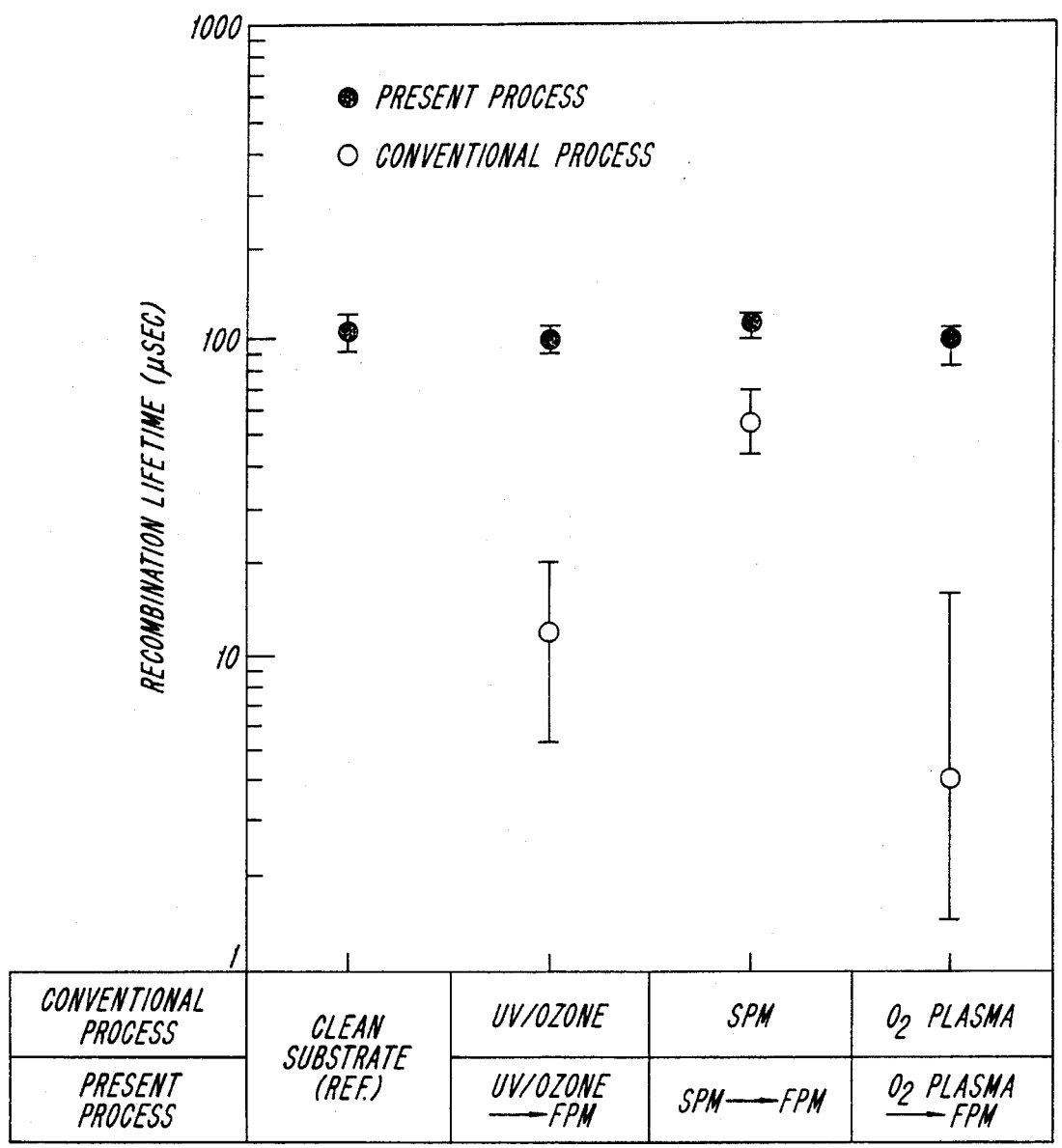
FIG. 4 is a plot comparing the washing effect of this invention with that of conventional method according to the recombination lifetime of the minority carrier.

FIG. 4 is a plot comparing the washing effect of this invention with that of conventional method according to the recombination lifetime of the minority carrier. Semiconductor substrates were contaminated on the surface with an organic material (photoresist was used in this test) and subjected to the treatment according to this invention and the treatment according to the conventional process, respectively. UV/ozone treatment, SPM treatment and $O_2$ plasma treatment were used as the conventional processes; whereas UV/ozone→$DHF/H_2O_2$ treatment, SPM→$DHF/H_2O_2$ treatment and $O_2$ plasma→$DHF/H_2O_2$ treatment were used as the present processes. The UV/ozone treatment, SPM treatment and $O_2$ plasma treatment were all carried out under the conditions so as to remove the photoresist completely.

In the conventional processes, the substrate subjected to UV/ozone treatment showed a notably reduced recombination lifetime to the order of two figures compared with the clean substrate (reference) having a recombination lifetime of about 100 μsec., and the recombination lifetime in the substrate subjected to $O_2$ plasma treatment showed nonuniform recombination lifetime within the semiconductor substrate, while the substrate subjected to SPM treatment showed less reduction in the recombination lifetime but it is not sufficiently cleaned to the level of clean substrate. In contrast with the conventional processes, the substrates subjected to the present processes all showed recombination lifetimes recovered to the level of a clean substrate.

It is shown that photoresists contain large amounts of metallic impurities, and they can hardly be removed by a dry method such as UV/ozone treatment and $O_2$ plasma treatment. Besides, in the $O_2$ plasma treatment, metallic impurities are sputtered from the metallic member such as the wall of the treating chamber onto the surface of the semiconductor substrates. On the other hand, the SPM treatment can remove the metallic impurities contained in the photoresist by dissolving them therein but finally allows formation of a natural oxide film on the surface of the semiconductor substrate which includes some metallic impurities such as Fe and Al therein. If these metallic impurities diffuse throughout the semiconductor substrate, they come to have energy levels near the gap center and cause lifetime reduction. Consequently, none of these conventional processes were successful in removing metallic impurities sufficiently. On the contrary, the additional $DHF/H_2O_2$ treatment employed in the present processes can remove the metal impurities together with the natural oxide film, so that the surface of the semiconductor substrate can be maintained clean.

The following Table shows the amounts of metallic impurities, determined by atomic absorption spectorphotometry, remaining on the surfaces of the semiconductor substrates after the present processes were applied. As the conventional processes oxide film RIE treatment and oxide film RIE→APM→HPM treatment were used; whereas as the present process oxide film RIE→$DHF/H_2O_2$ treatment was used.

TABLE

| | ($\times 10^{10}$ atoms/cm$^2$) | | | | |
|---|---|---|---|---|---|
| | Al | Fe | Cr | Ni | Cu |
| Clean substrate | 0.4 | 0.6 | 0.08 | 0.1 | 0.1 |
| Oxide film RIE | 1700 | 15 | 12 | 0.4 | 0.7 |
| Oxide film RIE → APM → HPM | 12 | 2 | 3 | 0.1 | 0.4 |
| Oxide film RIE → 4-DHF/H$_2$O$_2$ | 0.4 | 0.5 | 0.09 | 0.1 | 0.2 |

When only the oxide film RIE treatment of the conventional processes was applied, the surface of the semiconductor substrate was contaminated with various metals, particularly notably with Al, Fe, Cr and Ni from the molded parts such as electrodes and the wall of treating chamber. In the substrate additionally subjected to APM→HPM treatment after the oxide film RIE treatment, the metallic impurities were removed from the surface of the semiconductor substrate considerably but not sufficiently. On the contrary, the substrate subjected to the present treating process had substantially the same level of residual metallic impurities in terms of the respective elements as in the clean substrate.

As described above, the problem of heavy metal contamination inherent in the photoresist removing process and the plasma etching process can be solved by use of the treating process of this invention. Incidentally, while in the above embodiments, $DHF/H_2O_2$ treatment was used, exactly the same effect can be obtained when a $BHF/H_2O_2$ treatment is employed.

Figure 5A:
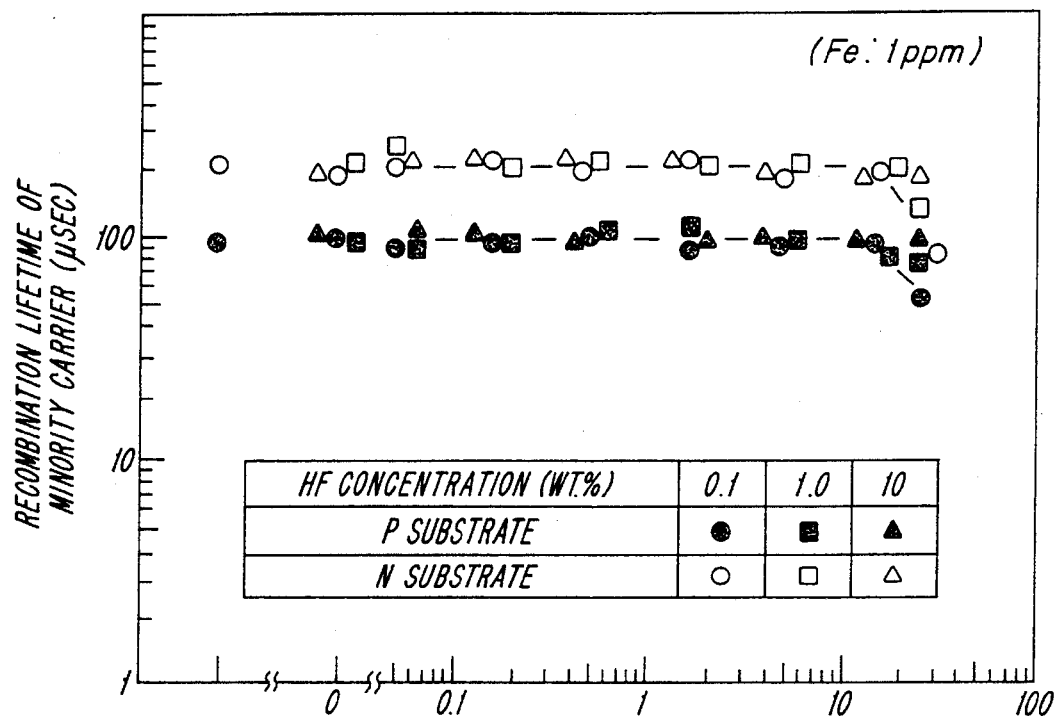
FIG. 5 is a plot showing the levels of metal impurities taken from the $DHF/H_2O_2$ treating solutions having different HF concentrations and $H_2O_2$ concentrations.
Figure 5B:
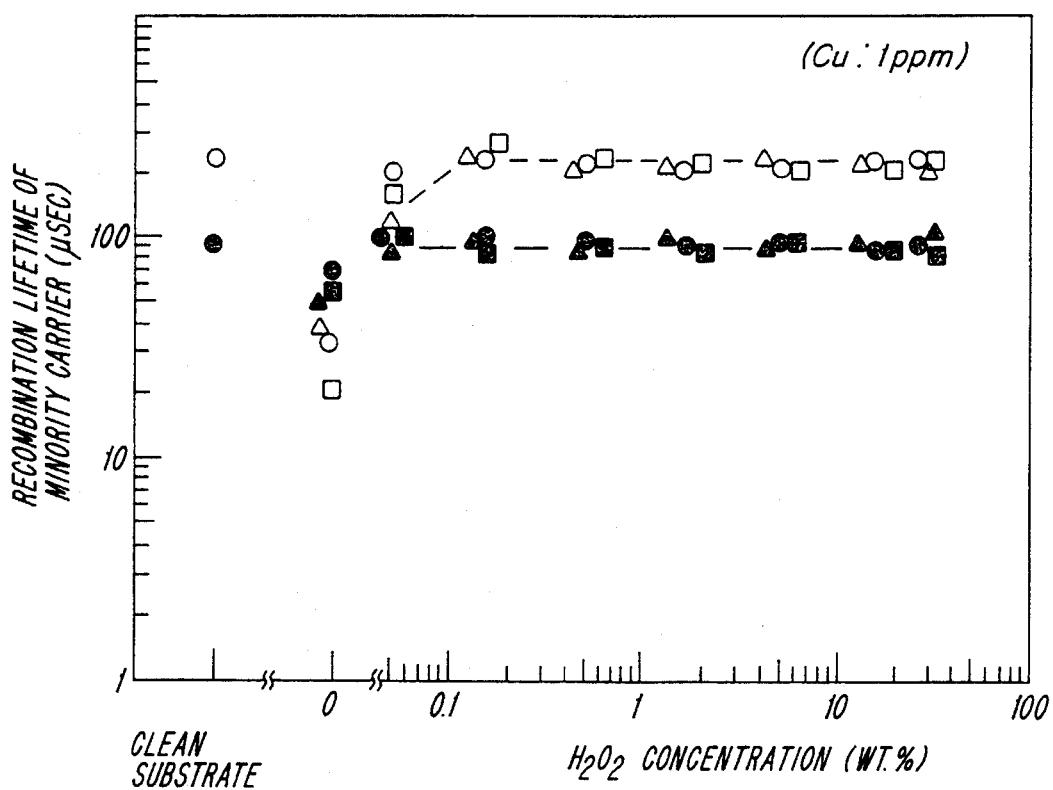

FIG. 5 is a plot showing the amounts of metal impurities taken from the $DHF/H_2O_2$ treating solutions having different HF concentrations and $H_2O_2$ concentrations. Semiconductor substrates were treated in treating solutions each containing 1 ppm of Fe or Cu for 10 minutes and then rinsed with a purified water for 10 minutes, respectively, followed by centrifugal drying. The evaluation was carried out by determining recombination lifetime of the minority carrier.

The substrates treated at the HF concentration of 0.1 to 10 wt % and at the $H_2O_2$ concentration of 0.1 to 15 wt % included no impurity and showed the same level of recombination lifetime as that of the clean substrate. However, the substrates treated at a $H_2O_2$ concentration of less than 0.1 started to include Cu, and a reduction of recombination lifetime was observed particularly in the negative substrates; while the substrates treated at a $H_2O_2$ concentration of more than 10 wt % underwent reduction of recombination lifetime due to Fe inclusion, wherein the surface of the semiconductor substrate is made hydrophilic since the hydrophobicity thereof was impaired as the $H_2O_2$ oxidation proceeds. Further, those substrates treated at a HF concentration of more than 10 wt % suffers hazing on the surface; a HF concentration of less than 0.1 wt % can show a low etch rate against the oxide film to have reduced ability of removing metals. Therefore, the optimum HF concentration and $H_2O_2$ concentration are 0.1 to 10 wt % and 0.1 to 15 wt %, respectively. The same applies to $BHF/H_2O_2$ when used as a treating solution.

Figure 6:
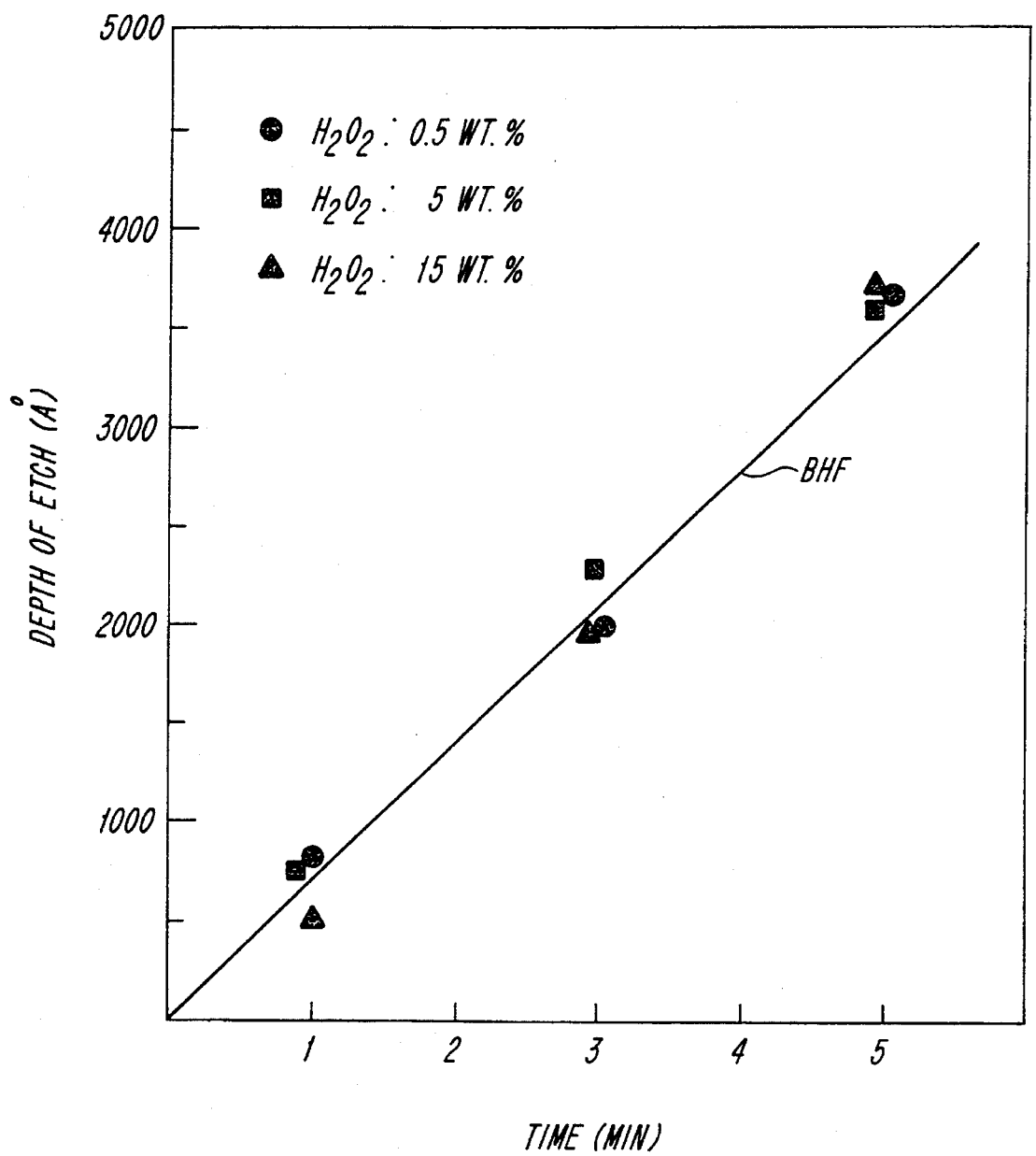
FIG. 6 is a plot of etch rates determined when the $H_2O_2$ concentration was varied in the $BHF/H_2O_2$ treating solution of this invention.

FIG. 6 is a plot of etch rate determined when the $H_2O_2$ concentration was varied in the $BHF/H_2O_2$ treating solution of this invention.

A 6000 Å oxide film was formed by thermal oxidation on the surface of each semiconductor substrate, and etching was carried out respectively by the conventional BHF treatment and the present $BHF/H_2O_2$ treatment for a predetermined time.

According to the present $BHF/H_2O_2$ treatment, substantially the same etch rate was obtained as in the conventional BHF treatment, which did not change even when the $H_2O_2$ concentration was varied. Accordingly, the treating process according to this invention can be employed for the etching of oxide film in the same manner as in the conventional BHF treatment.

As has been described heretofore, this invention provides a process for treating a semiconductor substrate which includes the process of treating the semiconductor substrate in a treating solution consisting of hydrofluoric acid, hydrogen peroxide and a purified water or in a treating solution consisting of hydrofluoric acid, ammonium fluoride, hydrogen peroxide and a purified water, and which allows less inclusion of metal impurities from the treating solution by adjusting the hydrofluoric acid concentration to 0.1 to 10 wt % and the hydrogen peroxide concentration to 0.1 to 15 wt % and has excellent ability of removing metal impurities with extremely reduced deposition of microparticles. The process of this invention was successful in reducing the number of microparticles deposited on the semiconductor substrate after treatment to 1/10 the level in the conventional process.

When the process of this invention was applied in the production of MOS capacitors and P-N diodes, the yield of the MOS capacitor was increased to 90% or higher, while the yield by the conventional process is about 60 to 70%; whereas yield of P-N diodes is about 75%. Accordingly, application of the treating process of this invention allows production of semiconductor devices with high quality and in high productivity.

I claim:

1. A process for treating a silicon substrate comprising a step of treating the silicon substrate in a treating solution consisting of hydrofluoric acid, hydrogen peroxide and purified water wherein said treating solution has a hydrofluoric acid concentration of 0.1 to 10 wt % and a hydrogen peroxide concentration of 0.1 to 15 wt %.

2. A process for treating a silicon substrate comprising a step of treating the silicon substrate in a treating solution consisting of hydrofluoric acid, hydrogen peroxide and purified water wherein prior to said step of treating the silicon substrate in said treating solution, the silicon substrate is pretreated in a mixture of ammonia, hydrogen peroxide and a purified water.

3. A process for treating a silicon substrate comprising a step of treating the silicon substrate in a treating solution consisting of hydrofluoric acid, hydrogen peroxide and purified water wherein prior to said step of treating the silicon substrate in said treating solution, the silicon substrate is pretreated in a mixture of sulfuric acid and hydrogen peroxide.

4. A process for treating a silicon substrate comprising a step of treating the silicon substrate in a treating solution consisting of hydrofluoric acid, hydrogen peroxide and purified water wherein prior to said step of treating the silicon substrate in said treating solution, the silicon substrate is pretreated in a mixture of hydrochloric acid, hydrogen peroxide and a purified water.

5. A process for treating a silicon substrate comprising a step of treating the silicon substrate in a treating solution consisting of hydrofluoric acid, hydrogen peroxide and purified water wherein prior to said step of treating the silicon substrate in said treating solution, the silicon substrate is subjected to ozone pretreatment with or without UV irradiation.

6. A process for treating a silicon substrate comprising a step of treating the silicon substrate in a treating solution consisting of hydrofluoric acid, hydrogen peroxide and purified water wherein prior to said step of treating the silicon substrate in said treating solution, the silicon substrate is subjected to a pretreatment of one of plasma etching and photoresist washing.

* * * * *